United States Patent
Broere

(10) Patent No.: US 7,210,633 B2
(45) Date of Patent: May 1, 2007

(54) SELF-COMPENSATING SPEAKER VOLUME CONTROL SYSTEM FOR DATA COLLECTION TERMINAL

(75) Inventor: Gerald D. Broere, Marion, IA (US)

(73) Assignee: Intermec IP Corp., Woodland Hills, CA (US)

( * ) Notice: Subject to any disclaimer, the term of this patent is extended or adjusted under 35 U.S.C. 154(b) by 106 days.

(21) Appl. No.: 10/993,641

(22) Filed: Nov. 19, 2004

(65) Prior Publication Data

US 2006/0108428 A1    May 25, 2006

(51) Int. Cl.
 *G06K 7/10* (2006.01)
(52) U.S. Cl. .................. 235/472.01; 340/501
(58) Field of Classification Search ..............
 235/462.01–462.25, 472.01, 472.02, 472.03;
 340/501, 692; 379/388.03, 387.01; 381/104,
 381/107, 57
 See application file for complete search history.

(56) References Cited

U.S. PATENT DOCUMENTS

| | | | | |
|---|---|---|---|---|
| 4,277,833 A | * | 7/1981 | Steffen | 702/128 |
| 5,287,827 A | * | 2/1994 | Almendinger et al. | 123/46 R |
| 5,966,438 A | * | 10/1999 | Romesburg | 379/388.03 |
| 6,731,993 B1 | * | 5/2004 | Carter et al. | 700/94 |
| 2005/0108642 A1 | * | 5/2005 | Sinclair | 715/700 |
| 2005/0168333 A1 | * | 8/2005 | Cronin | 340/501 |
| 2005/0226442 A1 | * | 10/2005 | Landon et al. | 381/104 |

* cited by examiner

*Primary Examiner*—Thien M. Le
(74) *Attorney, Agent, or Firm*—O'Melveny & Myers LLP

(57) ABSTRACT

A data collection terminal is provided with an audible feedback system that self-compensates for changes in ambient noise levels. The data collection terminal comprises a central processor adapted to execute stored instructions and having at least a display, a keyboard and a communications interface operatively coupled thereto. An audio driver is operatively coupled to the processor. The audio driver includes a speaker for producing sounds responsive to functions performed by the central processor and a microphone for receiving audio input signals. The audio driver adjusts the output volume of the speaker responsive to variations in ambient noise detected by the microphone so that the speaker produces a substantially consistent volume level in relation to the variations of ambient noise.

17 Claims, 3 Drawing Sheets

SELF-COMPENSATING SPEAKER VOLUME CONTROL SYSTEM FOR DATA COLLECTION TERMINAL

BACKGROUND OF THE INVENTION

1. Field of the Invention

The present invention relates to data collection and processing systems, and more particularly, to portable data terminals having a system for controlling speaker volume to compensate for varying ambient noise environments.

2. Description of Related Art

Portable data collection terminals are well known in the art for remote data collection applications such as inventory control, manufacturing and production flow management, and asset tracking. A mobile worker may use such a data collection terminal to collect, send and receive information while moving throughout a work area. The data collection terminal may either comprise a specialized device or a general purpose laptop computer or personal digital assistant (PDA) adapted for use in the particular application. Portable data collection terminals are also commonly used by sales persons, distributors, delivery persons, auditors, and the like, where it is advantageous to employ a portable data terminal in a route or otherwise mobile setting. Such applications include sales, distribution, control and inventory of products delivered, and delivery or tracking of products, packages, etc.

Portable data collection terminals typically include apparatus to facilitate efficient input and manipulation of data by a user. For example, a data collection terminal may include such apparatus as keypads, touch screens, laser scanners, optical indicia readers, and the like. Preferably, such apparatus allow the data collection terminal to read and manipulate data recorded in a variety of mediums and in many different formats. The data collection terminals often also include an audio output device, such as a speaker, to emit sounds in response to certain actions taken or functions performed. For example, it is known for a data collection terminal to emit a certain tones or beeps signifying that data (e.g., a bar code symbol) was faithfully collected by the terminal. Other sounds may be emitted for other purposes, such as to reflect failure to read the bar code symbol, entry of an improper key, receipt of an email message, rebooting of the terminal, and the like. The operator of the collection terminal may come to rely upon the audible feedback to ensure that data has been properly entered.

A drawback of these known audible feedback systems is that the data collection terminal is often used in work environments having varying levels of ambient noise. In a particularly loud work environment, such as on a factory floor, it may be difficult for the operator to hear the audible feedback over the ambient noise. To compensate, the operator may turn up the volume of the audible feedback, such as by adjusting a knob or manipulating a screen icon using a pointing device. When the operator exits the noisy environment and enters a quieter environment, such as a storage area or office floor, the operator must remember to turn back down the volume to prevent the amplified audible feedback from disturbing workers in that environment. As a result, the operator often finds that the volume must be continuously adjusted in correspondence with changes from one work environment to another.

Accordingly, it would be desirable to provide a data collection terminal in which the audible feedback volume does not need to be changed as the operator moves between different ambient noise environments.

SUMMARY OF THE INVENTION

The present invention addresses the shortcomings of the prior art systems and methods. In particular, the present invention is directed to a data collection terminal having an audible feedback system that self-compensates for changes in ambient noise levels.

In an embodiment of the invention, a data collection terminal comprises a central processor adapted to execute stored instructions and having at least a display, a keyboard and a communications interface operatively coupled thereto. An audio driver is operatively coupled to the processor. The audio driver includes a speaker for producing sounds responsive to functions performed by the central processor and a microphone for receiving audio input signals. The audio driver adjusts the output volume of the speaker responsive to variations in ambient noise detected by the microphone so that the speaker produces a substantially consistent volume level in relation to the variations of ambient noise.

In another embodiment of the invention, a method for controlling output audio level of a data collection terminal comprises the steps of: (1) sampling ambient noise levels; (2) receiving operator input defining a desired relative audio output level; and (3) adjusting an actual audio output volume responsive to variations in the sampled ambient noise levels so that the actual audio output level is substantially consistent in relation to the variations in the sampled ambient noise. The method further comprises producing a plurality of sample tones and receiving an operator selection of a desired volume level for the sample tones.

A more complete understanding of the data collection terminal with an audible feedback system that self-compensates for changes in ambient noise levels will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention provides a data collection terminal with an audible feedback system that self-compensates for changes in ambient noise levels. In the detailed description that follows, like element numerals are used to describe like elements illustrated in one or more figures.

Figure 1:
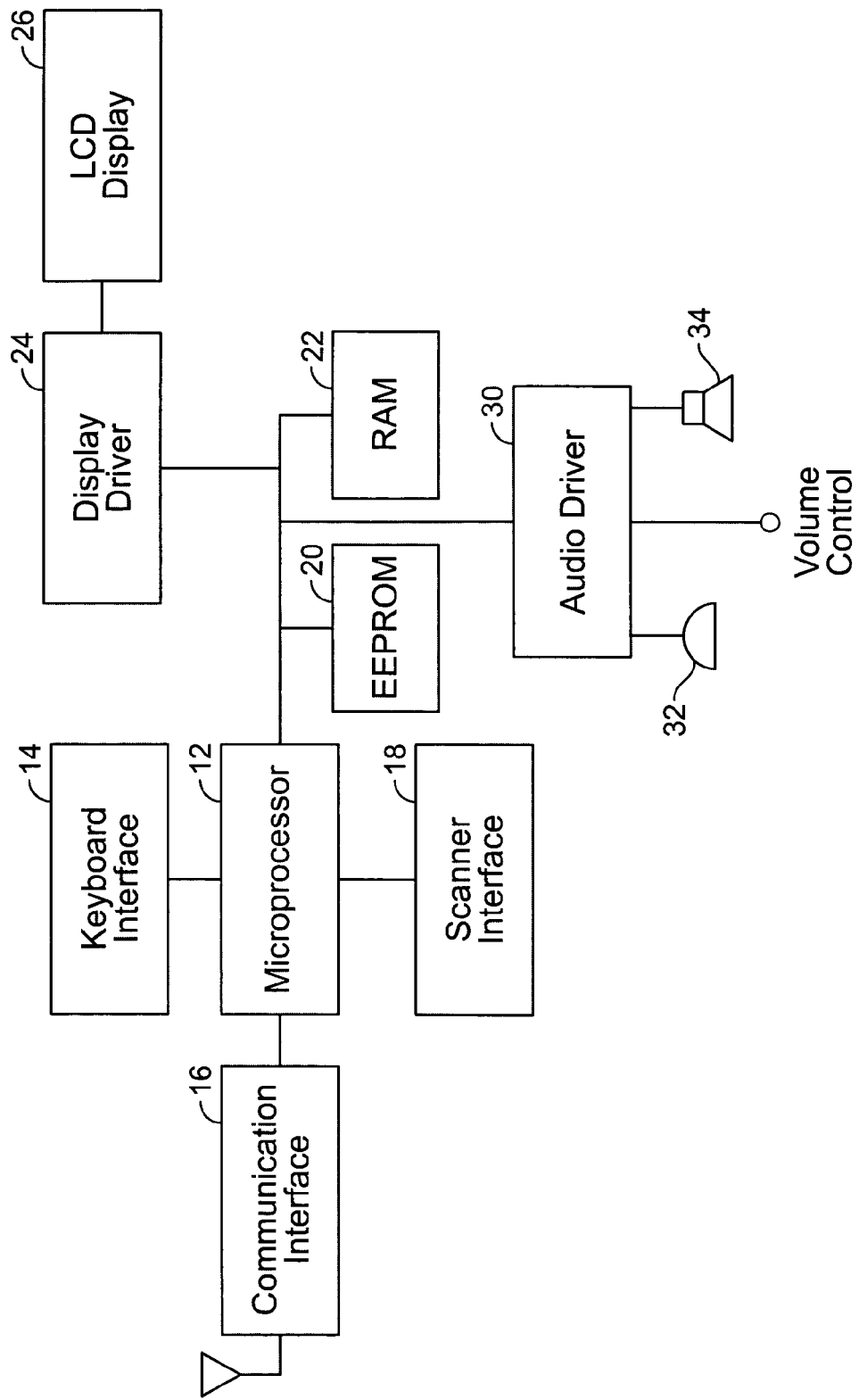
FIG. 1 is a block diagram of an exemplary portable data collection terminal.

Referring first to FIG. 1, a block diagram of an exemplary portable data collection terminal is illustrated. In a preferred embodiment of the invention, the data collection terminal is intended to be a handheld, microprocessor-controlled device used for collection of data such as bar codes and RFID tags, and for communication via a wireless local area network to a base station (not shown). Though not expressly described herein, it is understood that the hand-held data collection terminal and all of its circuits are powered by an internal battery power source. The data collection terminal will typically be provided with the capability of being plugged into a docking station for connection to the base station through a wired (e.g., Ethernet) network for data download and for battery recharge.

More particularly, the data collection terminal includes a microprocessor 12 that functions as a microcontroller and as an interface for communicating data and control signals to and from the base station. The microprocessor 12 is coupled to a keyboard interface 14, a communications interface 16, and a scanner interface 16. The keyboard interface 14 includes a keyboard enabling entry of data and commands into the device by the operator, and associated driver circuitry for interfacing the keyboard to the microprocessor 12. The communications interface 16 includes an antenna and a radio transmitter/receiver for communicating RF messages to and from the base station. The scanner interface 18 includes sensing circuitry and optical systems for reading bar code symbols or for providing input data from other external sources. Alternatively, or in addition, the scanner interface 18 may include suitable circuitry for reading and/or writing to RFID tags. The microprocessor 12 may be provided by any suitable device, such as a conventional microcontroller with on-chip masked ROM, RAM and built-in timers, ports, analog to digital converters and a serial interface. In addition to the on-chip memory capacity, an external EEPROM 20 and an external RAM 22 may be coupled to the microprocessor 12 through a suitable bus to provide additional data processing, programming and communication capacity. The data collection terminal further includes a display controller/driver circuit 24 coupled to the microprocessor 24 through the bus. The display controller/driver circuit 24 is adapted to drive an LCD display 26. It should be appreciated that each of the foregoing aspects of the data collection terminal are considered conventional, and that alternative arrangements of these circuit components may be advantageously utilized by persons having ordinary skill in the art.

The data collection terminal further includes an audio driver circuit 30 coupled to the microprocessor 12. The audio driver circuit 30 is further coupled to a microphone 32 and a speaker 34. The audio driver circuit 30 is further adapted to receive a volume control input. The volume control input may be an electrical signal that is varied by an input device mounted to a housing of the data collection terminal, such as a rotatable or slidable potentiometer. Alternatively, the volume control input could be produced by keyboard entries of by a touch screen display. The audio driver circuit 30 provides the function of driving the speaker 34 to produce audio output signals in response to certain actions taken or functions performed by the microprocessor 12. The volume control input permits manual control by the operator of the data collection terminal over the audio output volume produced by the speaker 34.

In accordance with an embodiment of the invention, the microphone 32 provides an electrical signal corresponding to a periodic sample of the magnitude of the ambient noise present in the environment within which the data collection terminal is operating. The ambient noise measurement is used by the audio driver circuit 30 as a baseline for determining the relative audio output volume produced by the speaker 34. When an operator selects a desired audio output volume, the audio driver circuit 30 adjusts the output volume relative to the ambient noise measurement. Thereafter, as the ambient noise measurement changes, such as due to movement of the operator through a factory, the audio driver circuit 30 will continue to adjust the relative output volume to compensate for the noise level changes. As a result, the data collection terminal will produce a relatively consistent audio output level as the ambient noise level changes.

It should be appreciated that the microphone 32 should be located on the exterior housing of the data collection terminal such that it can adequately sample the ambient noise environment. Mounting places to avoid would include under handstraps or anywhere in which an operator's hand would block the microphone during ordinary use. The microphone 32 may be dedicated for use with the audio driver circuit 30 for sampling ambient noise, or may be shared with other applications operating on the data collection terminal, such as for communicating voice messages.

Figure 2:
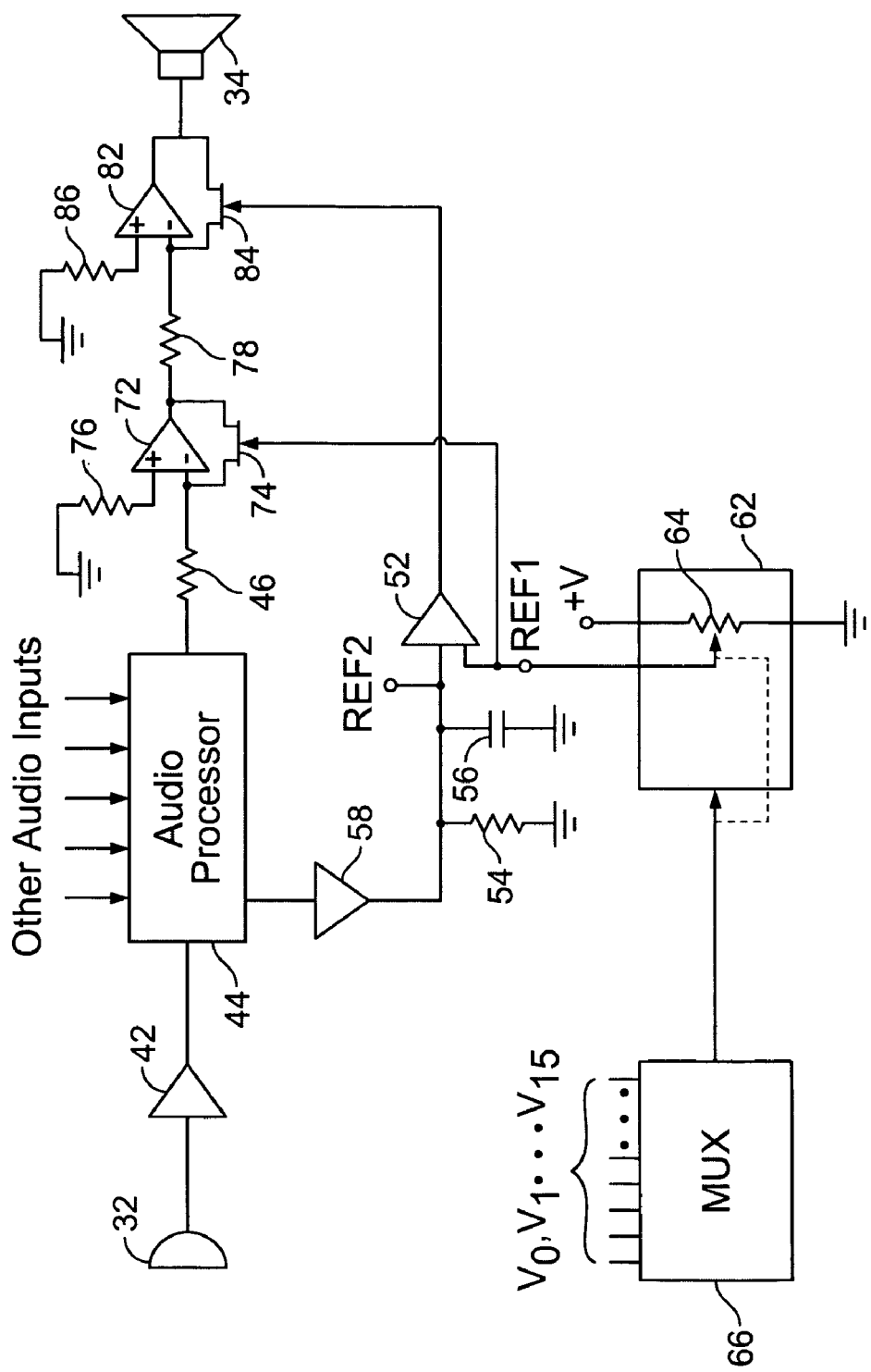
FIG. 2 is a block diagram of a self-compensating audible feedback system for the portable data collection terminal in accordance with an embodiment of the invention.

Referring now to FIG. 2, a block diagram of an exemplary audio driver circuit 30 is shown in accordance with an embodiment of the invention. The operator defines the desired audio output volume using a setting mode (described below), which defines a digital value that is stored in a corresponding register (not shown). The register provides a corresponding digital value to multiplexer 66, which provides a digital signal to digital potentiometer 62. While a 16-bit multiplexer is shown in FIG. 2, it should be understood that the size of the multiplexer 66 would depend on the desired amount of volume adjustment resolution. The digital potentiometer 62 includes a variable resistor 64 that defines a resistance value corresponding to the digital signal from multiplexer 66. The variable resistor 64 is coupled between a voltage source (+V) and ground, such that the digital signal from multiplexer 66 defines a variable voltage between +V and ground. The variable voltage provides a reference voltage (REF1) that corresponds to the desired audio output volume set by the operator. The reference voltage REF1 will be higher for higher volume levels selected.

The audio driver circuit includes an audio processor 44 that receives a plurality of audio inputs from the microprocessor 12 (see FIG. 1) and produces an audio output signal. The audio processor 44 selects from among the audio inputs to produce an output signal that is delivered to the speaker 34. The audio processor 44 also receives a noise sampling signal from the microphone 32, which passes through input amplifier stage 42. The audio processor 44 produces an output that corresponds to the sampling signal from the microphone 32. The output passes through a rectifier/filter 58 that provides full wave rectification and average filtering, and produces a reference output (REF2) that corresponds to an average RMS value of the sampling signal from the microphone 32. An RC network defined by resistor 54 and capacitor 56 coupled to the output of the rectifier/filter 58 provides high-pass filtering of the reference output REF2. The characteristics of the rectifier/filter 58 can be selected depending on the desired "sampling rate" of the input. Larger values will result in a longer time constant resulting in ambient noise being "remembered" for a longer period of time. Sampling can also be accomplished in other ways, such as using registers within the audio processor 44.

Comparator 52 compares the reference voltage REF1 (i.e., the user selected sound level) with the reference voltage REF2 (i.e., the sampled noise level), and produces a difference signal. The difference signal will be smaller as the difference between the reference voltages REF1, REF2 is smaller; conversely, the difference signal will be larger as the difference between the reference voltages REF1, REF2 is larger. For example, if the operator chooses a loud setting and the ambient noise level is high, the output of the comparator 52 will be low.

The output from the audio processor 44 passes through two amplifier stages before reaching the speaker 34. The first amplifier stage has gain controlled by reference voltage REF1, and the second amplifier stage has gain controlled by the difference signal from comparator 52. In other words, the first amplifier stage determines a level of amplification based on the volume setting defined by the user, and the second amplifier stage provides additional amplification as necessary to overcome background noise.

More particularly, the first amplifier stage includes operational amplifier 72, having a non-inverting input coupled to ground through resistor 76 and an inverting input coupled to the output of the audio processor 44 through resistor 46. A feedback loop between the output of the operational amplifier 72 and the inverting input is provided by field effect transistor 74. The gate terminal of the transistor 74 is driven by reference voltage REF1. As the value of REF1 increases, corresponding to an increase in the volume setting by the user, the drain-source resistance of the transistor 74 will increase and thereby increase the gain of the first amplifier stage. Thus, the volume setting through multiplexer 66 defines the "floor" level of amplification for the audio signal.

The second amplifier stage includes operational amplifier 82, having a non-inverting input coupled to ground through resistor 86 and an inverting input coupled to the output of the first amplifier stage through resistor 78. A feedback loop between the output of the operational amplifier 82 and the inverting input is provided by field effect transistor 84. The gate terminal of the transistor 84 is driven by difference signal from comparator 52 (corresponding to the difference between reference voltages REF1 and REF2). As the value of REF2 increases relative to REF1, corresponding to an increase in the detected noise level, the drain-source resistance of the transistor 84 will increase and thereby increase the gain of the second amplifier stage. Thus, when there is no background noise, there will be a unity gain through the second amplifier stage. The result will be a volume level that overcomes background ambient noise. Since the audio output waveform is effectively subtracted from the reference voltage difference signal, feedback caused by the user setting the volume too high is avoided.

It should be appreciated that the audio processor 44 can also be programmed to ignore several harmonics beyond the fundamental to assure that a potential feedback path is minimized. In the present embodiment, the audio processor 44 precludes the audio signal from passing directly from the audio inputs to the first and second amplifier stages, as such direct communication would be undesirable in many applications. Of course, it should be appreciated that the function of the audio processor 44 could be provided by other circuitry, such as the microprocessor 12 or could be eliminated altogether in other applications.

Figure 3:
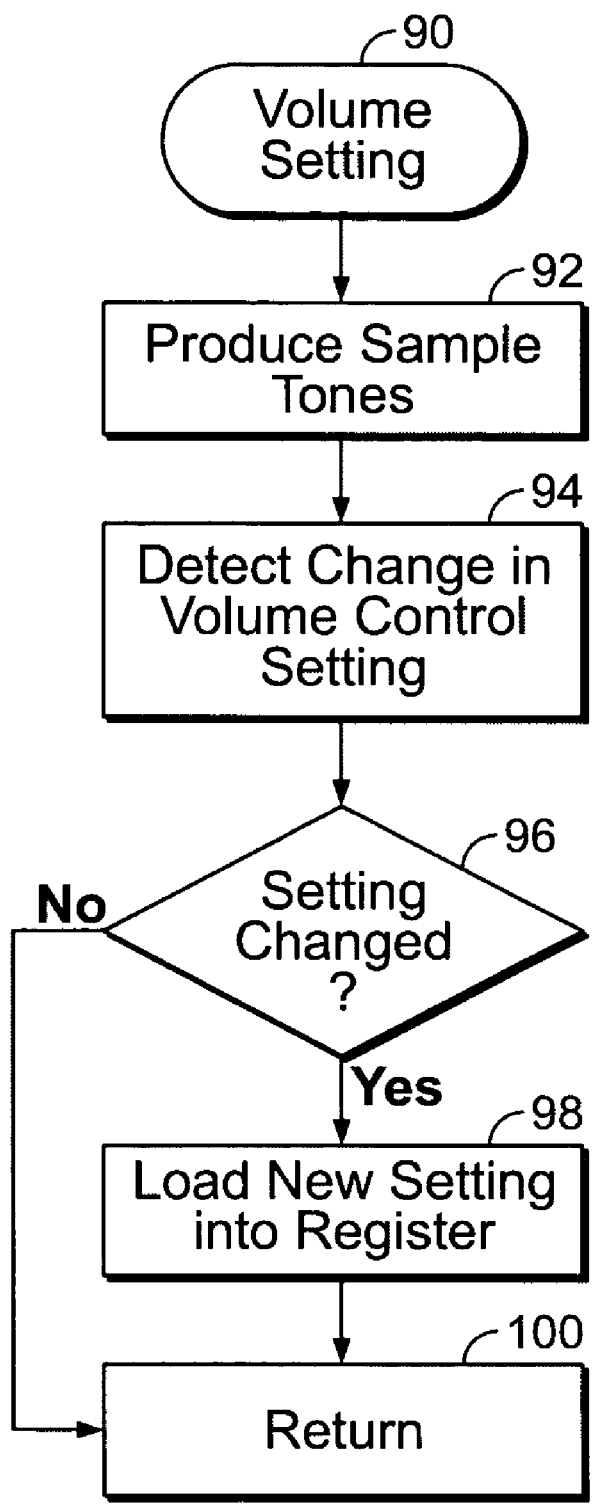
FIG. 3 is a flow diagram illustrating a method of receiving user volume setting signals for use with the self-compensating audible feedback system.

FIG. 3 illustrates a method of receiving user volume setting signals for use with the self-compensating audible feedback system. As noted above, the operator initiates a volume setting process 90, such as by selecting an icon on the LCD display or by pushing a button or turning a knob on the data collection terminal. The volume setting process 90 may be provided in the data collection terminal as a stored software or firmware program that is executed by the microprocessor 12. At step 92, the speaker 34 of the data collection terminal begins producing a series of sample tones. These sample tones may correspond to the specific sounds that the data collection terminal would produce in response to certain functions or events. Alternatively, the tones may be dedicated for use in the volume setting process, and may have no other application. The sample tones allow the operator to make a subjective determination that the volume of the tones is acceptable. At step 94, the operator would have the opportunity to alter the volume setting while listening to the tones, such as by adjusting a radio dial on the LCD display or adjusting a slidable or rotatable potentiometer (as discussed above). This way, the operator can identify a volume setting that is optimal.

The volume setting process makes a determination at step 96 as to whether the volume setting has changed from a previous volume setting operation. This determination is made by comparing a numerical value corresponding to the volume level to a previously stored numerical value. If the volume setting has changed, at step 98, the new value is loaded into a corresponding register, thereby replacing the previous value. This register value is then used to provide volume setting information to the audio driver 30 as discussed above with respect to FIG. 2. The volume setting process then ends at step 100 and returns to permit the microprocessor 12 to execute other functions. Conversely, if the volume setting has not changed, the process skips step 98 and ends at step 100.

Having thus described embodiments of a data collection terminal with an audible feedback system that self-compensates for changes in ambient noise levels, it should be apparent to those skilled in the art that certain advantages of the system have been achieved. It should also be appreciated that various modifications, adaptations, and alternative embodiments thereof may be made within the scope and spirit of the present invention. The invention is further defined by the following claims.

The invention claimed is:

1. A data collection terminal comprising:
a central processor adapted to execute stored instructions and having at least a display, a keyboard and a communications interface operatively coupled thereto; and
an audio driver operatively coupled to said processor, said audio driver including a speaker for producing sounds responsive to functions performed by said central processor and a microphone for receiving audio input signals, said audio driver adjusting an output volume of said speaker responsive to variations in ambient noise detected by said microphone so that said speaker produces a substantially consistent volume level in relation to said variations of ambient noise;
wherein said audio driver further comprises a first amplifier stage adapted to amplify an audio output signal to a volume level selected by a user and a second amplifier stage adapted to further amplify said audio output signal to compensate for said ambient noise.

2. The data collection terminal of claim 1, wherein said audio driver further comprises:
a first circuit adapted to generate a first reference signal corresponding to
a desired audio output volume relative to a baseline ambient noise level;
a second circuit adapted to generate a second reference signal corresponding to a current ambient noise level;
first means for comparing said first and second reference signals to determine a relative difference therebetween; and
second means for adjusting said output volume of said speaker in inverse proportion to said relative difference.

3. The data collection terminal of claim 2, wherein said first circuit comprises a digital potentiometer defining a first voltage corresponding to said desired audio output volume, said first voltage providing said first reference signal.

4. The data collection terminal of claim 2, wherein said second circuit comprises an audio processor receiving a current ambient noise signal from said microphone and providing said second reference signal.

5. A data collection terminal comprising:
a central processor adapted to execute stored instructions and having at least a display, a keyboard and a communications interface operatively coupled thereto; and
an audio driver operatively coupled to said processor, said audio driver including a speaker for producing sounds responsive to functions performed by said central processor and a microphone for receiving audio input signals, said audio driver adjusting an output volume of said speaker responsive to variations in ambient noise detected by said microphone so that said speaker produces a substantially consistent volume level in relation to said variations of ambient noise;
wherein said stored instructions further comprise a volume setting mode in which a plurality of sample tones are produced by said speaker and an operator selects a desired volume level for said sample tones.

6. The data collection terminal of claim 5, wherein a data value corresponding to said desired volume level is stored in a memory by said processor.

7. In a data collection terminal comprising a central processor adapted to execute stored instructions and having at least a display, a keyboard and a communications interface operatively coupled thereto, an audio level compensation circuit comprises:
a speaker for producing sounds responsive to functions performed by said data collection terminal;
a microphone for receiving audio input signals including ambient noise signals; and
an audio driver operatively coupled to said speaker and said microphone, said audio driver adjusting an output volume of said speaker responsive to variations in ambient noise detected by said microphone so that said speaker produces a substantially consistent volume level in relation to said variations of said ambient noise signals;
wherein said audio driver further comprises a first amplifier stage adapted to amplify an audio output signal to a volume level selected by a user and a second amplifier stage adapted to further amplify said audio output signal to compensate for said ambient noise.

8. The audio level compensation circuit of claim 7, wherein said audio driver further comprises:
a first circuit adapted to generate a first reference signal corresponding to a desired audio output volume relative to a baseline ambient noise level;
a second circuit adapted to generate a second reference signal corresponding to a current ambient noise level;
first means for comparing said first and second reference signals to determine a relative difference therebetween; and
second means for adjusting said output volume of said speaker in inverse proportion to said relative difference.

9. The audio level compensation circuit of claim 8, wherein said first circuit comprises a digital potentiometer defining a first voltage corresponding to said desired audio output volume, said first voltage providing said first reference signal.

10. The audio level compensation circuit of claim 8, wherein said second circuit comprises an audio processor receiving a current ambient noise signal from said microphone and providing said second reference signal.

11. In a data collection terminal, a method for controlling output audio level comprises:
sampling ambient noise levels;
receiving operator input defining a desired relative audio output level;
adjusting an actual audio output volume responsive to variations in said sampled ambient noise levels so that said actual audio output level is substantially consistent in relation to said variations in said sampled ambient noise, including amplifying an audio output signal to a volume level selected by a user and further amplifying said audio output signal to compensate for said ambient noise.

12. The method of claim 11, further comprising generating a first reference signal corresponding to said desired relative audio output level.

13. The method of claim 12, further comprising generating a second reference signal corresponding to said sampled ambient noise levels.

14. The method of claim 13, further comprising comparing said first and second reference signals to determine a relative difference therebetween.

15. The method of claim 14, further comprising adjusting said actual audio output level in inverse proportion to said relative difference.

16. In a data collection terminal, a method for controlling output audio level comprises:
sampling ambient noise levels;
receiving operator input defining a desired relative audio output level;
adjusting an actual audio output volume responsive to variations in said sampled ambient noise levels so that said actual audio output level is substantially consistent in relation to said variations in said sampled ambient noise; and
producing a plurality of sample tones and receiving an operator selection of a desired volume level for said sample tones.

17. The method of claim 16, further comprising storing said desired volume level in a memory.

* * * * *